(12) United States Patent  
Romanov

(10) Patent No.: US 7,355,424 B2
(45) Date of Patent: *Apr. 8, 2008

(54) TEST PROBE FOR FINGER TESTER AND CORRESPONDING FINGER TESTER

(75) Inventor: Victor Romanov, Wertheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/466,663

(22) Filed: Aug. 23, 2006

(65) Prior Publication Data

US 2007/0001693 A1    Jan. 4, 2007

Related U.S. Application Data

(63) Continuation of application No. 10/859,795, filed on Jun. 3, 2004, now Pat. No. 7,119,558, which is a continuation of application No. PCT/EP02/12770, filed on Nov. 14, 2002.

(30) Foreign Application Priority Data

Dec. 7, 2001    (DE)    ................................ 101 60 119

(51) Int. Cl.
G01R 31/02    (2006.01)
G01R 1/067    (2006.01)
G01R 31/00    (2006.01)

(52) U.S. Cl. ...................... 324/754; 324/537; 324/758
(58) Field of Classification Search ......... 324/754–765
See application file for complete search history.

(56) References Cited

U.S. PATENT DOCUMENTS

| | | | |
|---|---|---|---|
| 3,458,687 A * | 7/1969 | Cranch | ....................... 219/521 |
| 3,648,169 A | 3/1972 | Wiesler | |
| 4,123,706 A | 10/1978 | Roch | |
| 4,394,620 A | 7/1983 | Montalto et al. | |
| 4,956,923 A * | 9/1990 | Pettingell et al. | ............. 33/558 |
| 4,967,147 A | 10/1990 | Woods et al. | |
| 5,489,855 A * | 2/1996 | Poisel | ........................ 324/762 |
| 5,804,982 A | 9/1998 | Lo et al. | |
| 6,037,764 A | 3/2000 | Smith et al. | |
| 6,046,599 A | 4/2000 | Long et al. | |
| 6,051,978 A | 4/2000 | Swart | |
| 6,127,832 A | 10/2000 | Comulada et al. | |
| 6,344,751 B1 | 2/2002 | Prokopp et al. | |
| 6,369,592 B1 | 4/2002 | Majka et al. | |
| 6,426,638 B1 * | 7/2002 | Di Stefano | ................. 324/754 |
| 6,677,773 B2 | 1/2004 | Prokopp | |

FOREIGN PATENT DOCUMENTS

CA    2 211 703    8/1996

(Continued)

OTHER PUBLICATIONS

Translation of International Preliminary Examination Report from PCT/EP2002/012770, filed on Nov. 14, 2002.

*Primary Examiner*—Ha Tran Nguyen
*Assistant Examiner*—Emily Y Chan
(74) *Attorney, Agent, or Firm*—Houston Eliseeva LLP

(57) ABSTRACT

A test probe for a finger tester for the testing of non-componented circuit boards has a test needle with a probe tip which may be brought into contact with a circuit board test point, and which may be pivotably attached to a mount by means of at least two flexible sprung retaining arms. It is distinguished by the fact that at least one of the retaining arms is made of an electrically conductive material and is electrically connected to the test needle. In a corresponding finger tester, the test probe is driven by a linear motor.

22 Claims, 10 Drawing Sheets

FOREIGN PATENT DOCUMENTS

| | | |
|---|---|---|
| EP | 0 460 911 A2 | 12/1991 |
| EP | 0 468 153 A1 | 1/1992 |
| EP | 0 660 387 A2 | 6/1995 |
| EP | 0 853 242 A1 | 7/1998 |
| EP | 0 990 912 A2 | 4/2000 |
| WO | 96/24069 | 8/1996 |

* cited by examiner

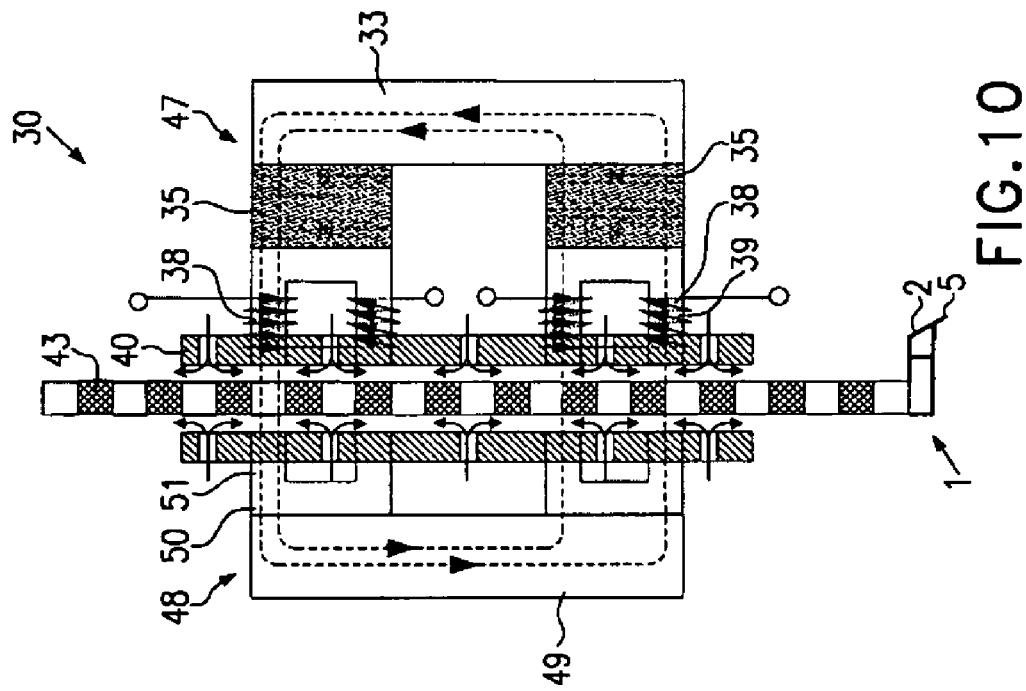
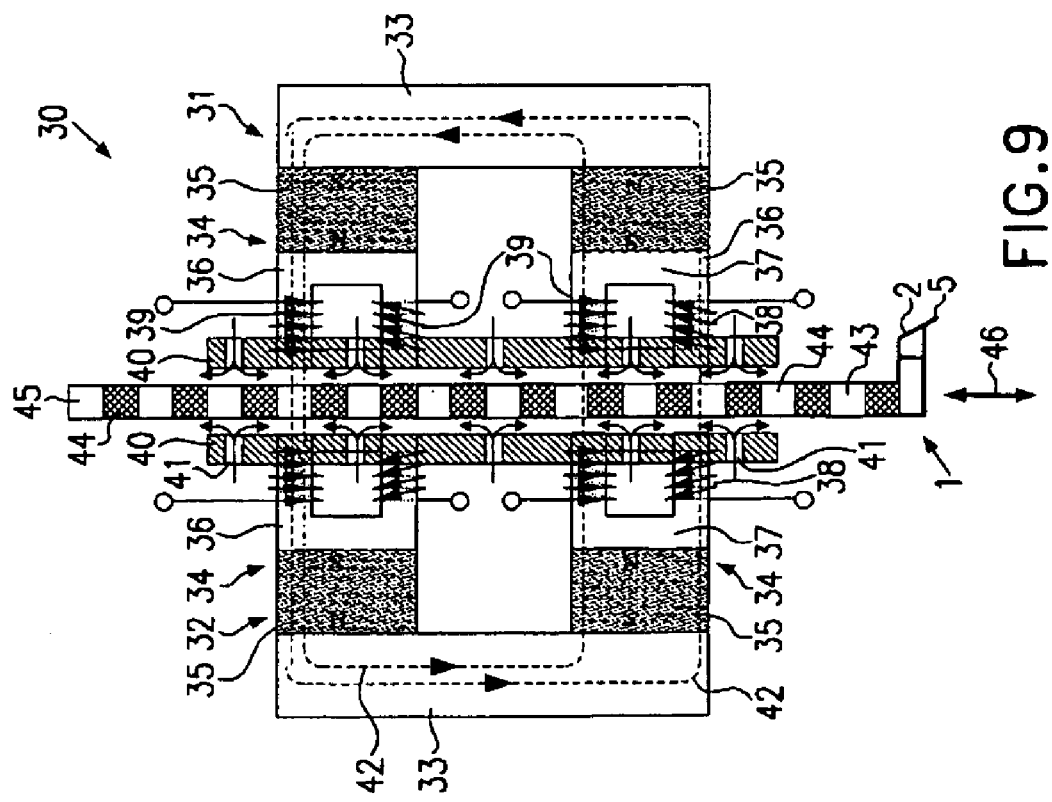
FIG.9
FIG.10

TEST PROBE FOR FINGER TESTER AND CORRESPONDING FINGER TESTER

RELATED APPLICATIONS

This application is a Continuation of U.S. application Ser. No. 10/859,795, filed on Jun. 3, 2004, now U.S. Published Application No. US 2005/0001639 A1, published on Jan. 6, 2005, which is a Continuation of PCT application serial number PCT/EP02/12770 filed on Nov. 14, 2002, which was published in the German language under PCT Article 21(2), and which claims priority to DE 101 60 119.0, filed on Dec. 7, 2001, all of which are incorporated herein by reference in their entirety. This application is also related to U.S. application Ser. No. 11/121,802, filed on May 4, 2005, now U.S. Published Application No. US 2005/0206398 A1, published on Sep. 22, 2005, which is also incorporated by reference in its entirety.

BACKGROUND OF THE INVENTION

Basically, test equipment for the testing of circuit boards may be divided into two categories, namely finger testers and parallel testers. Parallel testers are test devices that, by means of an adapter, simultaneously contact all or at least the majority of contact points of a circuit board to be tested. Finger testers are test devices for the testing of non-componented or componented circuit boards, which scan the individual contact points sequentially with two or more test fingers.

In the testing of non-componented circuit boards, as compared with the testing of componented circuit boards or in-circuit testing, many more circuit board test points must be contacted. Consequently the main criterion for successful marketing of a finger tester for non-componented circuit boards is the throughput of contacted circuit board test points within a predetermined period of time.

The test fingers are generally fastened to a slide that is able to move along cross-bars, while the cross-bars in turn are guided and able to move along guide rails. The slides may thus be positioned at any desired point on a test field, which is usually rectangular. For contacting a contact point of a circuit board to be tested, the slide is able to move vertically on the cross-bar, so that the test finger may be placed on the contact point of the circuit board from above and from below.

A finger tester is described in EP 0 468 153 A1, and a method of testing circuit boards using a finger tester is described in EP 0 853 242 A1. EP 990 912 A discloses a test probe for a finger tester in which a test needle is movably guided in such a way that it can extend out from the test probe to contact a circuit board test point. If a circuit board test point is contacted, then the test needle can deflect to the side, thereby limiting the mechanical stress on the circuit board test point. In this case the test needle is driven by an electromagnetic drive. Also known are test probes in which a sprung test needle is used. If the test needle is mounted vertically relative to the circuit board to be tested there is the disadvantage that two circuit board test points lying closely adjacent to one another can not be contacted since, owing to the size of the sprung test needles, the latter cannot be arranged with their probe tips as close together as may be desired.

To avoid this disadvantage, the test needles have been mounted—in a suitable tester—at an angle to the circuit board to be tested. This makes it possible to arrange two test needles with their probe tips very close together. However this has the drawback that, in pressing down the sprung test needles, the probe tip is moved along the surface of the circuit board to be tested. With high contact speeds this can cause a scratch on the circuit board. Moreover, due to the inclined position of the test needle, the point at which the circuit board is contacted is imprecise, since the probe tip is moved parallel to the surface of the circuit board.

To avoid these problems, test probes have been developed with a relatively long, horizontally mounted spring arm, with the test needle formed on its end. On this long spring arm it is advantageous that a deflection by only a small angle produces a relatively large spring movement. By this means the movement parallel to the surface of the circuit board to be tested may be kept small but not completely avoided. With a test probe of this kind there is also a risk of the surface of a circuit board to be tested being scratched. In addition the size of the spring arm makes the test probe relatively heavy, which can lead to damage to the circuit board if the probe tip is placed on it at high speed. To reduce such damage a photoelectric switch, which can detect any deflection of the spring arm, is provided in the area of the spring arm. In the event of deflection of the spring arm, the movement of the test probe is braked or stopped, so that any further damage to the circuit board is avoided as much as possible.

Owing to the considerable size of the spring arm it is very costly to shield it from electrical radiation, which is problematic in the case of measurements with high-frequency signals.

Another known test probe has, as test needle, a rigid needle, which is fastened to a mount by means of a parallel steering unit. The parallel steering unit is comprised of two retaining arms made of plastic, with one end attached to a mount, while the rigid needle is attached to the other end of the retaining arms. When the parallel steering unit is swivelled, this needle may be moved vertically upwards. An end section of the test needle carrying the probe tip is bent relative to the remainder of the test needle, so that the probe tip projects a little from the test probe. By this means it is possible for two closely adjacent circuit board test points to be contacted by two test probes. The retaining arms of the parallel steering unit are so dimensioned that a swivelling movement of the parallel steering unit produces the smallest possible movement parallel to the surface of the circuit board.

The disadvantage of this test probe is that the cable used to supply the measuring signal and which is attached to the test needle, due to its strength and weight, generates a considerable impulse when the test probe impinges rapidly on a circuit board, which may lead to damage of the circuit board to be tested. This applies especially to an embodiment in which two test needles are attached to a parallel steering unit, with a cable attached to each test needle so that a 4-wire measurement may be made.

Disclosed by U.S. Pat. No. 5,804,982 is a test probe for testing the contact points of integrated circuits. This test probe has two elastic retaining arms, which are fastened by one end to a frame of a tester. The two retaining arms are arranged parallel to one another and have, at the end remote from the frame, a non-magnetic body, which is mounted between the two end points of the retaining arms. Fitted in the lower section of the body is a test needle. Provided between the retaining arms are magnetic coils which act together with a further magnet in such a way that they are able to exert a vertically downwards force on the retaining arms.

A contact point of an integrated circuit is contacted by means of this test probe by excitation of the magnetic coils located in the test probe, so that the test needle is moved on to the contact point.

WO 96/24069 concerns a device for the testing of flat components (in-circuit test). The test probe of this device has a pivotable test needle which with one end contacts the test point of the flat component, and at the other end has a movement mimic arrangement to swivel the test needle.

SUMMARY OF THE INVENTION

The invention relates to a test probe for a finger tester for the testing of non-componented circuit boards, and a corresponding finger tester.

The invention is based on the problem of creating a test probe for a finger tester, and a corresponding finger tester, for the testing of non-componented circuit boards, wherein the test probe may be brought into contact with the circuit board to be tested at a high speed without causing damage to the circuit board.

In general, according to one aspect, the invention features a test probe for a finger tester for the testing of circuit boards, with no independent drive, and with a test needle with a probe tip which may be brought into contact with a circuit board test point, and which may be pivotably attached to a mount by means of at least two pairs of flexible sprung retaining arms. At least one of the retaining arms is made of an electrically conductive material and is electrically connected to the test needle and each pair of retaining arms is mounted in one plane, with one end fixed to the test needle and the other end to the mount, and spanning a triangle when viewed from above.

In general, according to another aspect, the invention features a finger tester for the testing of non-componented circuit boards comprising a linear motor with two static magnetic flux elements arranged opposite one another, and an armature plate mounted movably between them and made of a non-magnetic material and having at regular intervals strip-shaped armature elements made of a magnetic material. A test probe is mounted on the armature plate and the test probe is provided with a finger tester for the testing of circuit boards, with no independent drive, and with a test needle with a probe tip which may be brought into contact with a circuit board test point, and which may be pivotably attached to a mount by means of at least two flexible sprung retaining arms. At least one of the retaining arms is made of an electrically conductive material and is electrically connected to the test needle.

The test probe according to the invention preferably has a test needle which may be brought into contact with a circuit board test point by a probe tip. The test needle is pivotably mounted on a parallel steering unit by at least two retaining arms. It is distinguished by the fact that at least one of the retaining arms is made of an electrically conductive material and is electrically connected to the test needle.

In the case of the test probe according to the invention, the measuring signal can be fed to the test needle via the electrically conductive retaining arm. The test needle is consequently not connected to any cable which would cause an impulse when the test probe makes contact with a circuit board to be tested. On the other hand, when the test probe makes contact with the circuit board, only the test needle is moved on the parallel steering unit relative to the mount, so that the force exerted on the circuit board is comprised solely of the movement impulse of the test needle and the spring force exerted by the retaining arms. Due to the low weight of the test needle, its impulse is very low. The same applies to the spring force exerted by the retaining arms.

Thus, using the test probe according to the invention, a low, precisely defined contact force is exerted in contacting the circuit board—even with rapid movement of the probe.

According to a preferred embodiment, at least two retaining arms are made of an electrically conductive material and are electrically connected to the test needle. This permits a 4-wire measurement.

According to a further preferred embodiment of the invention, two pairs of retaining arms are provided. Each pair of retaining arms is arranged in one plane, with one end fastened to the test needle and the other end to the mount, so that when viewed from above, each pair of retaining arms forms a triangle. A variant of this kind with four retaining arms makes possible on the one hand a 4-wire measurement using two of the four retaining arms, and the electrical contacting of a shielding element by means of a further retaining arm. This spatial arrangement of the retaining arms also has the advantage that the test needle is held to the mount in a very stable and defined manner.

The retaining arms of the parallel steering unit are preferably so dimensioned that the test needle is held in an angled position relative to the circuit board to be tested but, during swivelling movement of the test needle, the probe tip makes no movement or else only an extremely small movement parallel to the surface of the circuit board to be tested.

The finger tester according to the invention for the testing of non-componented circuit boards comprises a linear motor with two static magnetic flux elements arranged opposite one another and, mounted between them, a movable armature plate made of a non-magnetic material and with strip-like armature elements made of a magnetic material, at regular intervals, with a test probe according to the invention mounted on the armature plate.

The combination of the test probe according to the invention with a linear motor with a movable armature plate, which is very easily designed, allows a drastic increase in throughput in the contacting of circuit board test points as compared with known finger testers, since only low masses need to be accelerated and in addition, when the probe tip makes contact with the circuit board test point, the impulse is softened by the test probe.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 9 is a schematic view of a first embodiment of a linear motor;

FIG. 10 is a schematic view of a second embodiment of a linear motor;

DETAILED DESCRIPTION OF THE PREFERRED EMBODIMENTS

Figure 1:
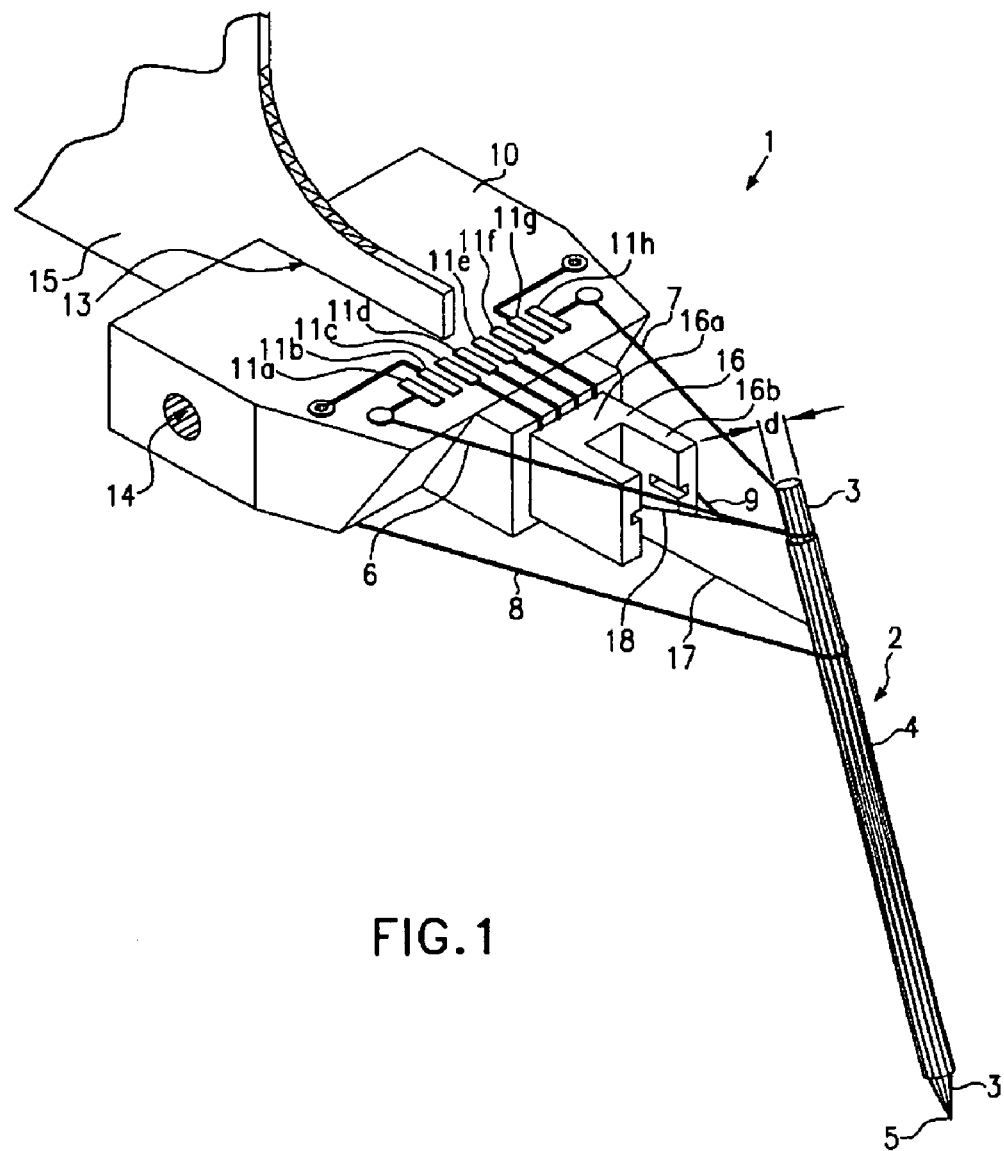
FIG. 1 is a perspective view of a first embodiment of a test probe according to the invention.
Figure 2:
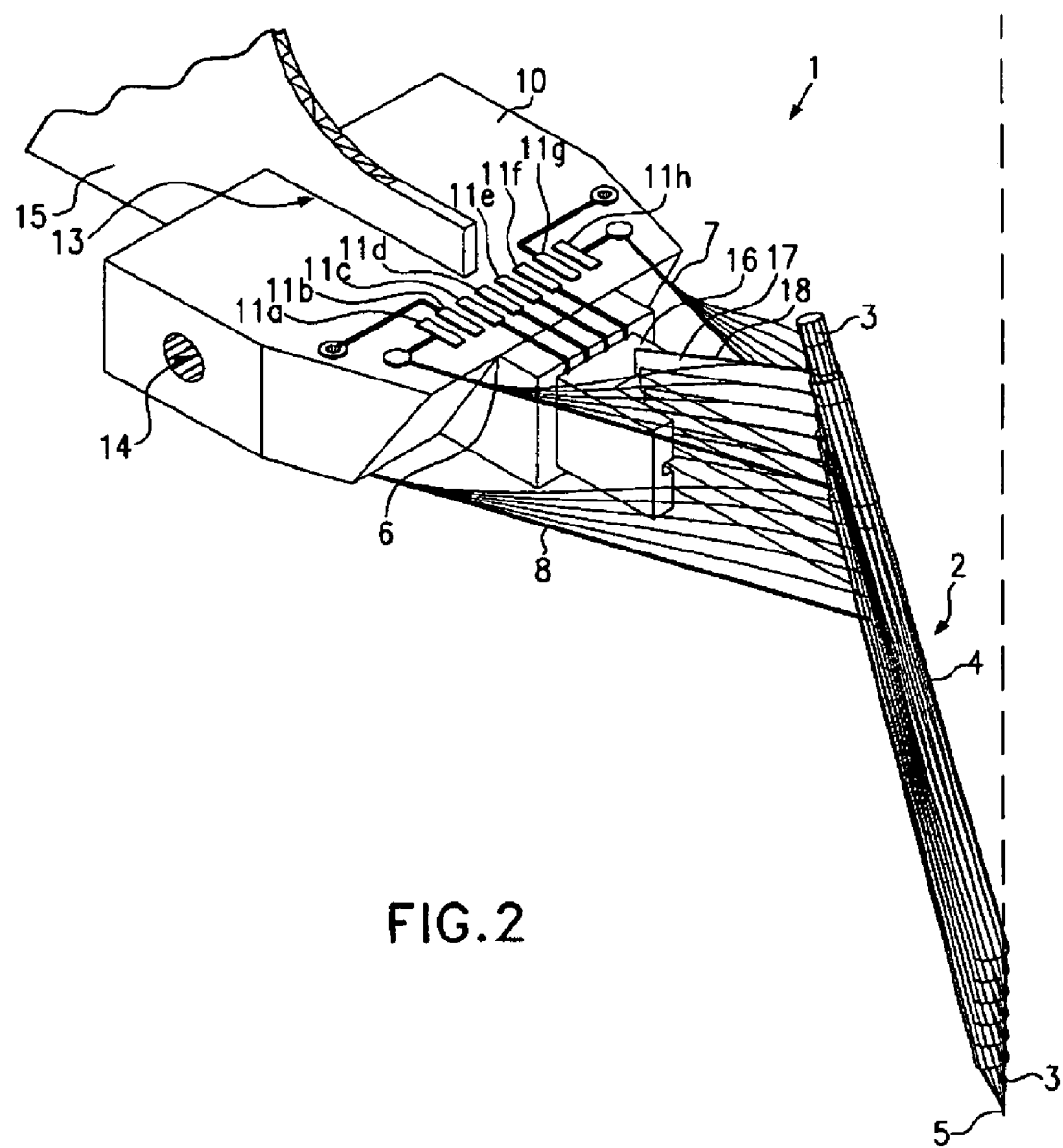
FIG. 2 shows the test probe of FIG. 1, with the test needle shown in both the original position and in the deflected positions.

FIGS. 1 and 2 show a first embodiment of a test probe 1 according to the invention. The test probe has a test needle 2, formed in the present embodiment by a needle 3 with a diameter d of 0.3 to 0.5 mm.

The needle 3 is made for example of steel or tungsten. The needle 3 is coated with an insulating layer which is polytetrafluoroethylene or Teflon® material, for example. The coating is covered in turn by an electrically conductive layer. This coating with the electrically conductive layer forms a shield 4 which shields the needle 3 from electrical fields.

The needle 3 extends with both ends from the shield 4, with one of the two ends tapering to form a probe tip 5. At the end opposite the probe tip, the test needle 2 or needle 3 is connected to two retaining arms 6, 7, which will subsequently be described as the upper retaining arms.

Two further retaining arms 8, 9 are fastened to the shield 4, a short distance away from the connection point, between the upper retaining arms 6, 7 and the test needle 2. The retaining arms 8, 9 will subsequently be described as the lower retaining arms.

The two pairs of retaining arms 6, 7 and 8, 9 respectively are each formed by a wire element bent in the middle, with the test needle 2 fastened at the bending point by means of an electrically conductive connection, e.g. a soldered joint. Each of the two pairs of retaining arms 6, 7 and 8, 9 thus forms an isosceles triangle, with the test needle 2 located in the apex of the isosceles triangle.

The retaining arms 6 to 9 are fixed to the mount 10 by their ends which are furthest from the test needle 2. The mount 10 is an electrically insulating plastic part, provided on the top with a row of contact faces 11a to 11h. Each of the upper retaining arms 6, 7 is electrically connected via conductor paths to the contact faces 11a and 11h respectively. The lower retaining arms 8, 9 are each connected via an electrically conductive metal pin 12 (FIG. 4) extending vertical through the mount 10, and a conductor path, to the contact face 11b and 11g respectively.

These contact faces 11a to 11h are connected via further conductor paths (not shown) to an electrical plug connector (not shown) formed on the mount 10. The mount 10 is in the form of a plug-in element which may be plugged into a test head of a finger tester.

In the present embodiment the mount 10 has a slot 13, which leads to the side face of the mount 10 located away from the test needle 2. The mount 10 also has a through hole 14, arranged at right-angles to the slot 13. Using the slot, the mount 10 can thus be pushed against a thin wall 15 of the test head, and fixed by means of a pin passing through the through hole 14 in the mount and a corresponding through hole in the wall 15. When the mount 10 is pushed on to or plugged into the wall 15 of the test head, the conductor paths connected to the contact face 11a to 11h are electrically connected to corresponding conductor paths of the test head.

Fitted to the mount 10, on the side face adjacent to the test needle 2, is a photoelectric switch element 16. In plan view the photoelectric switch element 16 is U-shaped, with a base 16a and two limbs 16b. Located on the end section and the inside of one of the two limbs 16b is a light source, and on the other limb 16b is a light sensor which receives the light signal. The light source and the light sensor thus form an optical measuring section. In the horizontal plane, the light source and the light sensor have a specific longitudinal extent, amounting to e.g. 1 mm. Fixed to the test needle 2 is a measuring vane 17, made e.g. of a thin metal sheet. This measuring vane 17 lies in a longitudinal centre plane of the test probe 1, which is arranged vertically and forms the mirror plane to the retaining arms 6, 7 and 8, 9 respectively. The upper edge of the measuring vane 17 is designed as a measuring edge 18 and runs, in the original position shown in FIG. 1, in which the retaining arms 6 to 9 run in a straight line, at an angle to a horizontal plane, and is located directly below the optical measuring section.

In placing the test probe 1 on a circuit board to be tested, the test needle 2 is subjected to a force which causes the retaining arms to be swivelled from the original position into a swivelled-out position (upwards in FIGS. 1 and 2). By this means, the measuring edge 18 is introduced into the optical measuring section. Due to the provision of the inclined measuring edge 18, the optical measuring section is interrupted in proportion to the distance by which the test needle moves relative to the mount 10, so that the signal measured by the photoelectric switch is proportional to the distance moved by the test needle.

The photoelectric switch element 16 is connected via each of four conductor paths to one of the contact faces 11c to 11f which, just like the other contact faces, are connected to the test head by means of an electrical plug connector.

Figure 5:
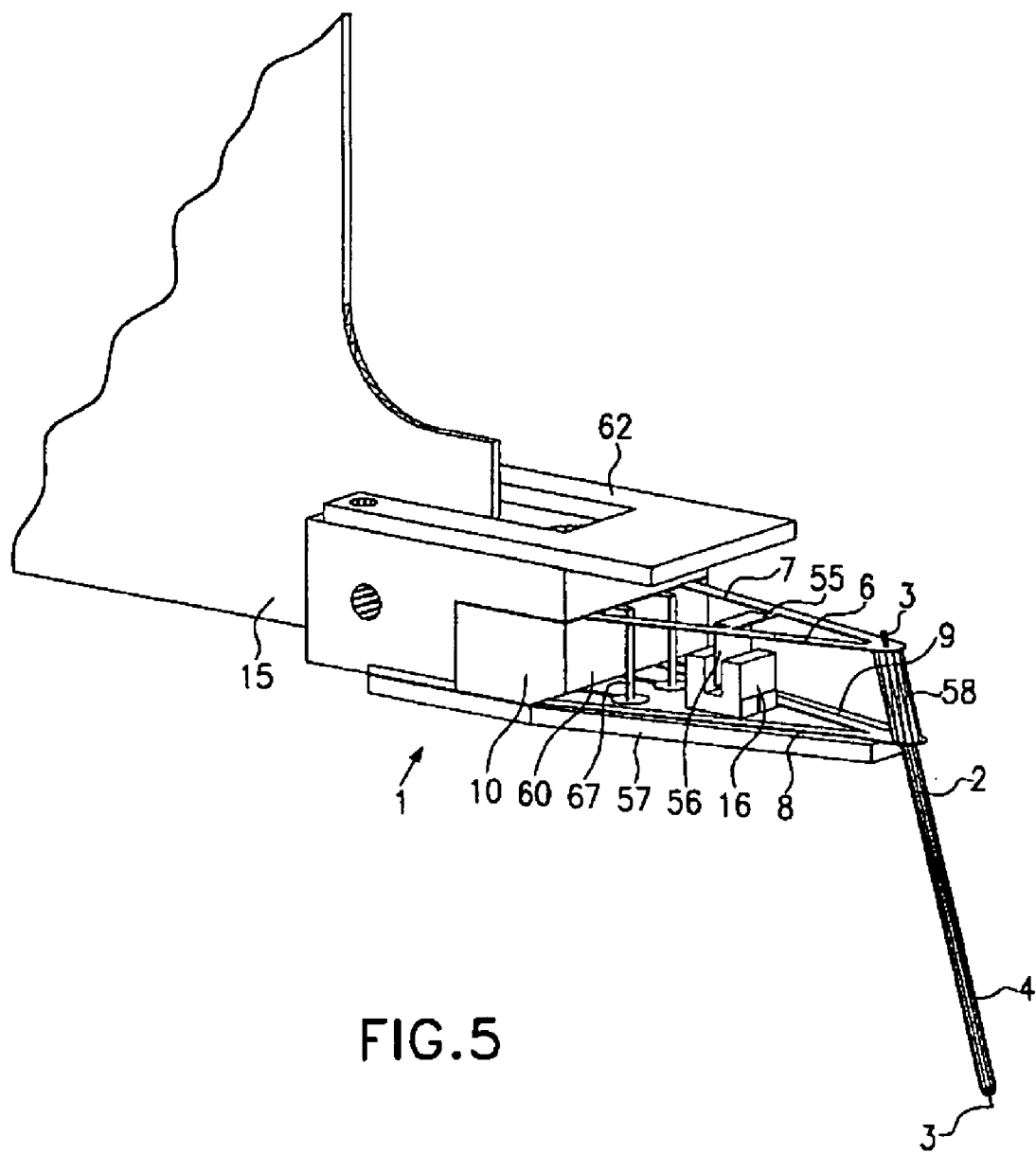
FIG. 5 shows a third embodiment of a test probe according to the invention in a perspective view.
Figure 7:
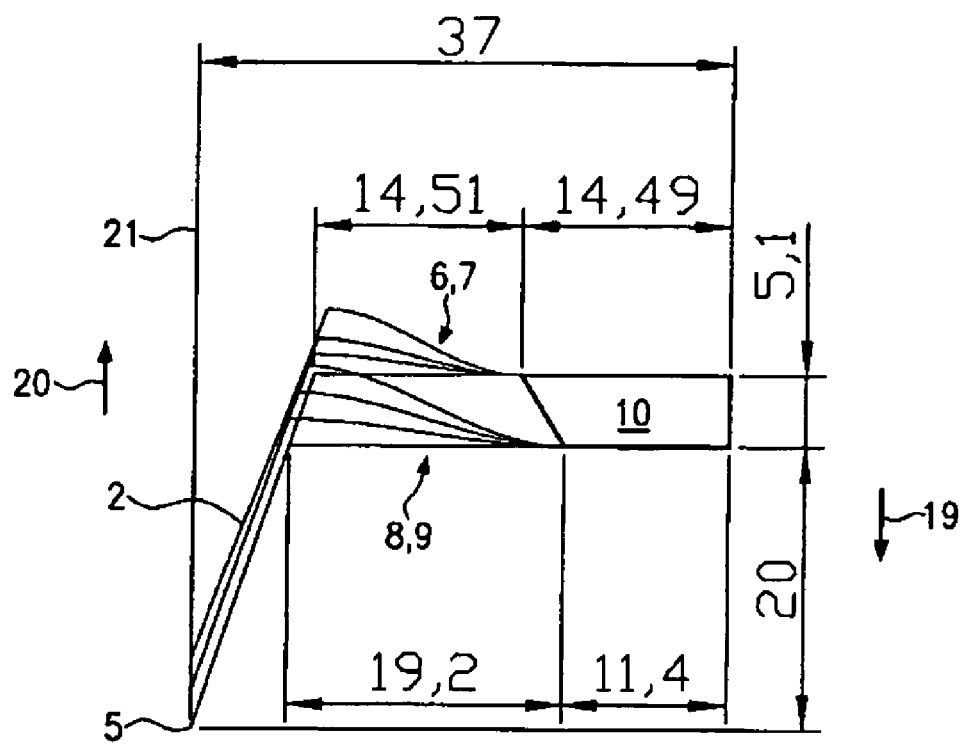
FIG. 7 is a schematic side view with dimensions of a test probe according to the invention.

FIG. 7 shows in schematic from a side view of the test probe 1 according to the invention with the mount 10 and the upper and lower retaining arms 6, 7 and 8, 9 respectively, and the test needle 2. When the test probe 1 is brought into contact with a circuit board to be tested, the test probe. 1 with the probe tip 5 is placed on the circuit board (direction 19). This involves the test needle 2 moving in the direction of arrow 20 relative to the mount 10 (upwards in FIG. 5). This direction 20 is described hereafter as the direction of movement 20 of the test needle 2. Viewed from the side, together with the corresponding boundary edge of the mount 10 and the section of the test needle 2 located between the upper and lower retaining arms, the upper and lower retaining arms 6, 7 and 8, 9 form a trapeziod. The lengths of the individual sections, given in millimeters in FIG. 7, are so dimensioned that in movement of the test needle 2, the probe tip 5 is moved over a certain distance of e.g. 5 millimeters (mm) along a straight line 21 which is at right-angles to the planes spanned by the upper retaining arms and the lower retaining arms in their original position.

Since the direction 19 in which the test probe 1 is moved towards the circuit board is exactly opposite to the direction of movement 20 of the test needle relative to the mount 10, and the probe tip is moved along a straight line parallel to the direction of movement 20, no movement component is generated parallel to the surface of the circuit board to be tested, thereby ensuring that the probe tip 5 does not scratch the surface of the circuit board. Thus the probe tip is not moved horizontally when the test probe is placed on the test piece.

Figure 12:
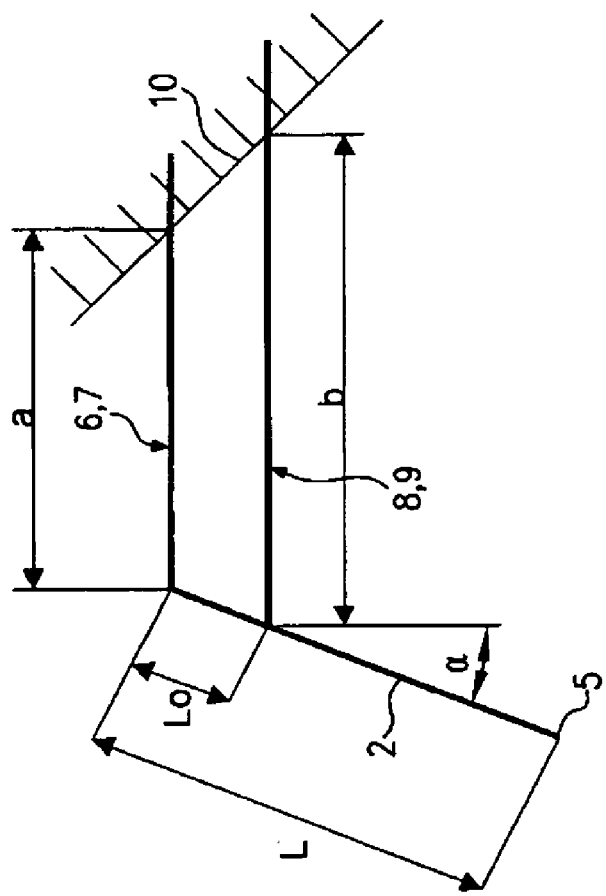
FIG. 12 is a schematic side view of a test probe.

FIG. 12 shows the trapezoidal arrangement of the test probe schematically in a side view, in which the length of the upper retaining arms 6, 7 in side view is designated by the variable a, the length of the lower retaining arms 8, 9 by the variable b, the length of the test needle 2 by the variable L, and the length of the section of the test needle 2 between the upper and lower retaining arms by the variable L0. In the arrangement shown in FIG. 12, the probe tip is not moved when the test needle is placed in position, if these lengths conform for instance to the following formula:

$$a \approx b\left(1 - \tan\frac{L_0}{L}\right)$$

This formula applies to the angular range of $$0 \le \alpha < \frac{\pi}{2}.$$

This formula may also be represented by the following series expansion:

$$a \approx b\left(1 - \frac{L_0}{L} - \frac{1}{3}\left(\frac{L_0}{L}\right)^3 - \frac{2}{15}\left(\frac{L_0}{L}\right)^5 - \ldots\right)$$

For small movements of the test probe this formula may be simplified as follows:

$$a \approx b\left(1 - \frac{L_0}{L}\right)$$

The formulae stated above thus describe an embodiment in which the probe tip is moved substantially vertically. This applies to the trapezoidal arrangement shown in FIG. 12.

In placing the test probe 1, as may be discerned with the aid of FIGS. 2 and 7, the test needle 2 is deflected elastically relative to the mount 10, from the original position shown in FIG. 1 in the direction of movement 20, with the retaining arms 6 to 9 acting as elastic spring elements. The result of this is that, when the test probe 1 is placed on a circuit board to be tested, only the movement or inertia impulse of the test needle 2 and the spring forces exerted by the retaining arms 6 to 9 are exerted on the circuit board to be tested. Since the test needle weighs less than 0.1 gram and preferably less than 70 milligrams, the its inertia or impulse is very low, and the force exerted on the circuit board is substantially determined solely by the spring hardness of the retaining arms.

This test probe can be guided on to a circuit board to be tested at a high movement velocity without damaging the circuit board, since the impulse transmitted is very low and the spring forces are precisely defined.

The movement of the test probe 1 is preferably controlled by the signal detected by the photoelectric switch. If the test needle 2 is moved in direction of movement 20, then the measuring vane 17 enters the optical measuring section, which is detected by a corresponding electrical signal. Since the signal is proportional to the path of the test needle 2, the measuring signal may be used to determine how far the test needle has moved from the original position. After a certain deflection distance, e.g. 1 mm, the movement of the test probe 1 can be braked.

By this means the maximum deflection of the test needle 2 relative to the mount 10 is limited, which in turn limits the spring force exerted on the circuit board by the retaining arms via the test needle 2. Thus the force exerted on a circuit board can be kept very low and even if the test probe 1 is moved on to the circuit board to be tested with high velocity, the surface of the circuit board to be tested will not be damaged due to the low movement impulse transmitted and the limited spring force.

Figure 8:
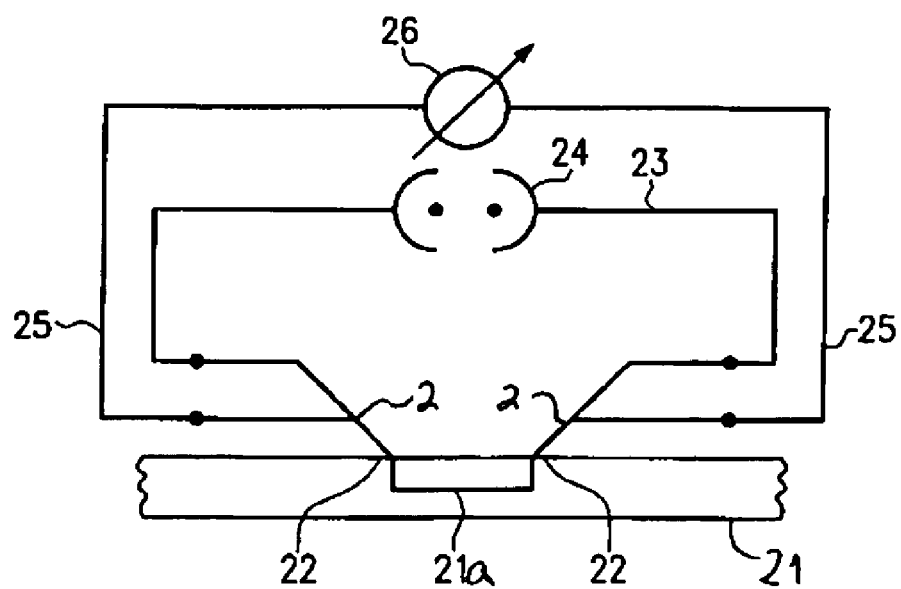
FIG. 8 shows a schematic simplified circuit diagram of a 4-wire measurement with two test probes according to the invention.

FIG. 8 shows, in schematic simplified form, a measuring set-up for measuring the electrical resistance of a conductor path 21a of a circuit board 21 to be tested. The conductor path 21a has a circuit board test point 22 at both ends. A test probe 1 with a test needle 2 is placed on each of the two circuit board test points 22. Each of the two test needles 2 is connected via conductor paths 23 to a current source 24. The test needles 2 are also each connected via conductor paths 25 to a high-impedance voltmeter 26. This circuit, which has two electrical circuits with a current source and a voltmeter, is described as a 4-wire circuit. It can be used to measure a resistance very precisely, since the current flowing through the voltmeter 26 is extremely low. In the case of the test probe 1 of the embodiment according to the invention, one of the two upper retaining arms 6, 7 is connected to the conductor 23 and the other to the conductor 25. The resistance of the circuit board 21 to be tested is thus influenced only by the resistance of the test needles 2 and the contact resistance between the test needles 2 and the circuit board test points.

Figure 3:
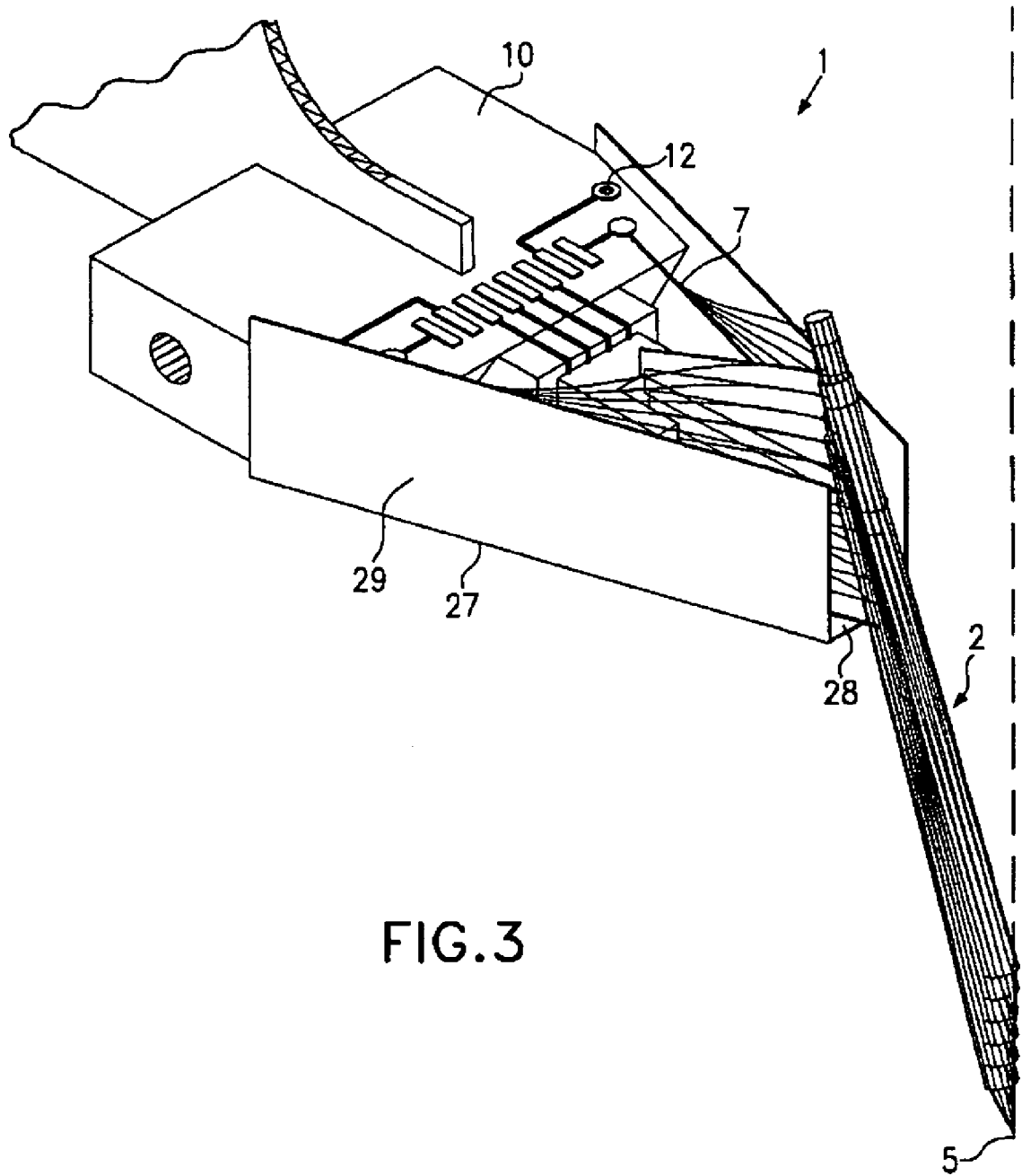
FIG. 3 shows a second embodiment of a test probe according to the invention in a perspective view.
Figure 4:
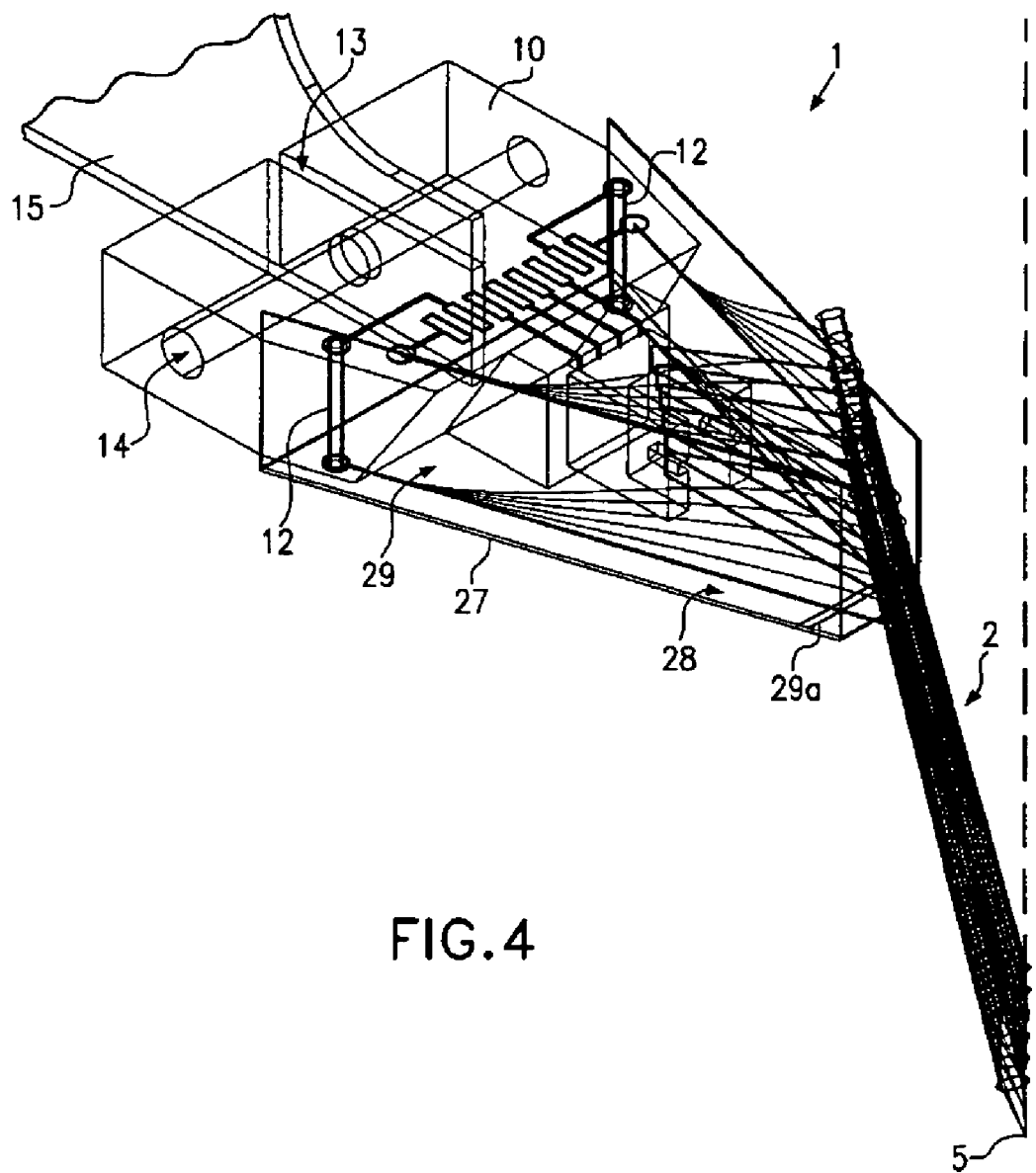
FIG. 4 shows the test probe of FIG. 3 in a view in which the individual elements are made transparent.

FIGS. 3 and 4 show a second embodiment in which the retaining arms 6 to 9 are located within an electrically conductive trough 27 which shields the retaining arms acting as electrical supply lines from electrical radiation. This trough 27 has a base 28 and two side walls 29.

The trough 27 is, like the lower retaining arms 8, 9, electrically connected to the earthed or ground pins 12. Adjacent to the test needle 2 on the base 28 is a transverse web 29a which limits the downwards movement of the lower retaining arms 8, 9, wherein the transverse web 29a is mounted higher than the fixing point of the lower retaining arms 8, 9 to the mount 10. By this means the unit comprised of test needle 2 and retaining arms 7 to 9 is raised a little above the original position shown in FIG. 1, and the retaining arms 6 to 9 are under pre-tension.

This pre-tension ensures that in the event of rapid acceleration of the test probe 1, on account of the forces occurring during acceleration the test needle 2 is not moved relative to the mount 10, possibly triggering the photoelectric switch with its measuring Vane in an undesired manner.

Within the scope of the invention it is also possible to provide, instead of a trough, a tubular shield element, which also shields the retaining arms from above.

Figure 6:
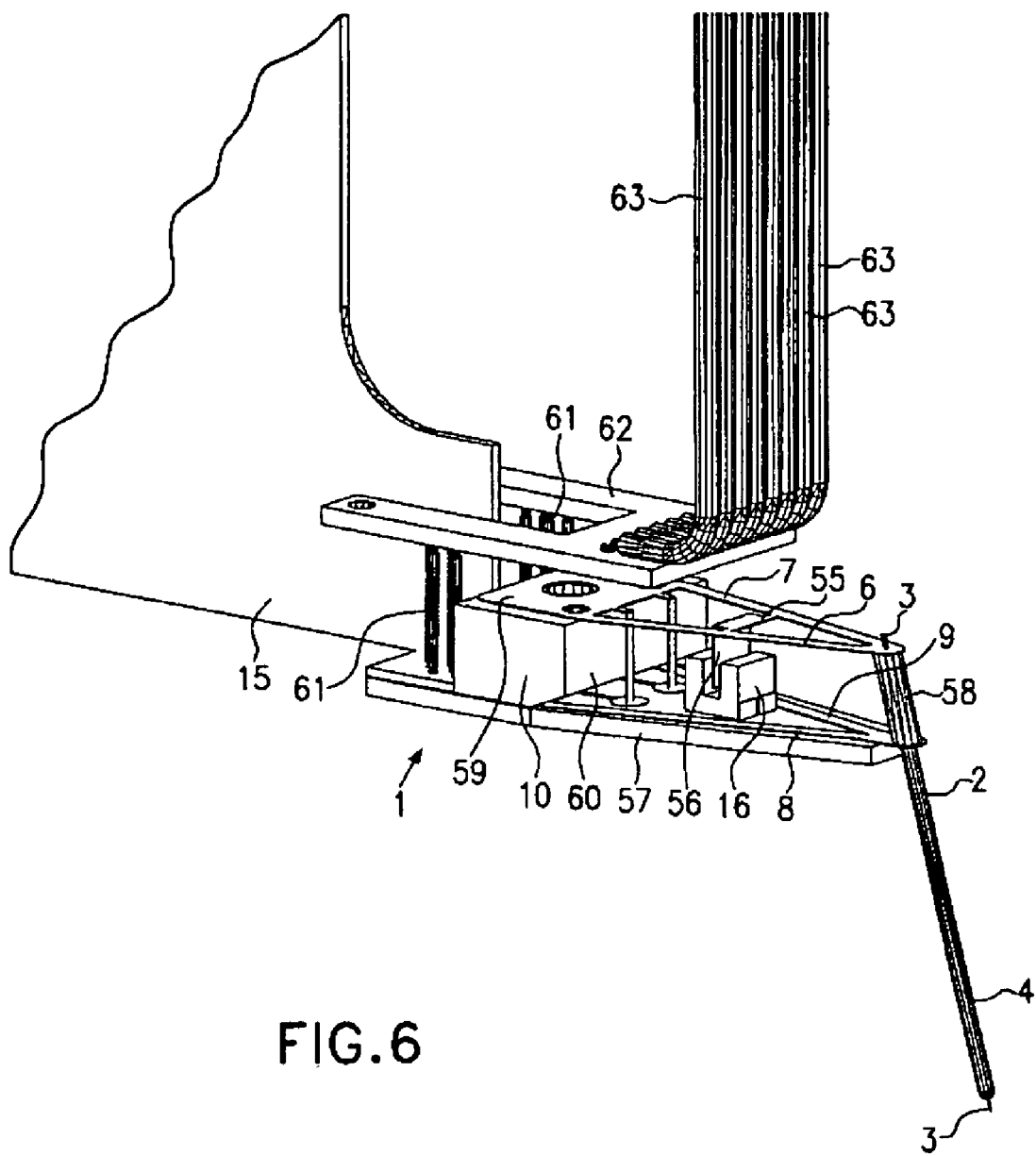
FIG. 6 shows a perspective view of the test probe of FIG. 5 without a housing.

A third embodiment of the test probe (FIGS. 5, 6) is substantially of exactly the same design as the two embodiments described above, for which reason identical parts are given the same reference numbers. The two upper retaining arms 6, 7 and the two lower retaining arms 8, 9 are each made with a wall thickness of approximately 50 micrometers (μm) to 200 μm by etching from a thin copper/beryllium sheet or spring steel. Any sheet metal with good electrical conductivity and good elastic properties is suitable. The pairs of retaining arms are therefore narrow sheet metal strips, arranged in a V shape when viewed from above. Formed roughly in the longitudinal centre between the upper retaining arms 6, 7 is a transverse web 55, to which a measuring vane 56 is bonded and bent downwards. The transverse web is located at that point on the retaining arms at which the direction of curvature of the retaining arms changes on deflection (=point of inflection) (FIG. 7).

The measuring vane 56 in turn has a measuring edge (not shown), which engages in a photoelectric switch element 16. This measuring edge is however aligned horizontally and the light source and the light sensor extend vertically, so that the photoelectric switch element 16 emits a signal proportional to the insertion depth of the measuring vane 56. The retaining arms 6,7 and 8, 9 respectively end at a plate 59 which is fastened to the mount 10 by, for example, a bonded, screw or rivet connection.

The lower retaining arms 8, 9 lie on a base plate 57 which is made of a non-electrically conductive material. Viewed from above, the base plate 57 is V-shaped in the area from the mount 10 to the test needle 2, i.e. tapering from the mount 10 towards the test needle 2. The base plate 57 limits the downwards movement of the retaining arms.

As in the two embodiments described above, the test needle 2 is provided and arranged with a needle 3 and a shield 4. In the area between the lower and upper retaining arms 8, 9 and 6, 7 it has a spacer sleeve 58, which is made of electrically-insulating material and surrounds the shield 4 in the area between the retaining arms 8, 9 and 6, 7. The spacer sleeve 58 is physically connected to the retaining arms 6, 7 and 8, 9, so that the retaining arms are held at a distance by their end which is furthest away from the mount 10. The upper retaining arms 6, 7 are electrically connected to the needle 3, and the lower retaining arms 8, 9 are electrically connected to the shield 4.

In this embodiment the mount 10 is a roughly square body, fitted on to the base plate 57, with the plate of the lower retaining arms 8, 9 located between the mount 10 and the base plate 57. The bottom edge of the wall 60 of the mount 10 facing the test needle 2 is bevelled, so that the lower retaining arms 6, 7 are slightly exposed and are able to move freely upwards from an area behind the wall 60.

On the side facing away from the test needle 2, the base plate 57 extends outwards a little from the mount 10. In this area, contact points are arranged on the base plate 57, from which contact pins 61 lead upwards and end at a contact plate 62. Fastened to the latter are electrical wires 63 which are electrically connected to the contact pins 61, and by which the test probe 1 is electrically connected to the tester. In this area the base plate 57 is also physically connected to the wall 15 of the test head.

Via conductor paths on the base plate 57, the photoelectric switch element 16 and the upper retaining arms 6, 7 are electrically connected to the contact pins 61, while connecting webs 67 lead downwards from the plate 59 of the upper retaining arms to the base plate 57, and are contacted at corresponding conductor paths.

In its mode of operation, the third embodiment of the test probe corresponds to the two embodiments described above.

In a further embodiment, instead of one test needle per test probe, it is possible to have two test needles arranged parallel adjacent to one another and supported by the retaining arms, so that a 4-wire measurement may be made, in which this circuit containing the current source and that containing the voltage source are brought together only at the circuit board test point 22.

A further advantage of the test probe according to the invention is that, if test probes collide, which may occur with faulty programming of the finger tester, the retaining arms act as predetermined break points, so that only the relatively small module of the test probe 1 according to the invention on one test head is damaged, and may also be repaired by fitting a new test needle and new retaining arms.

Figure 11:
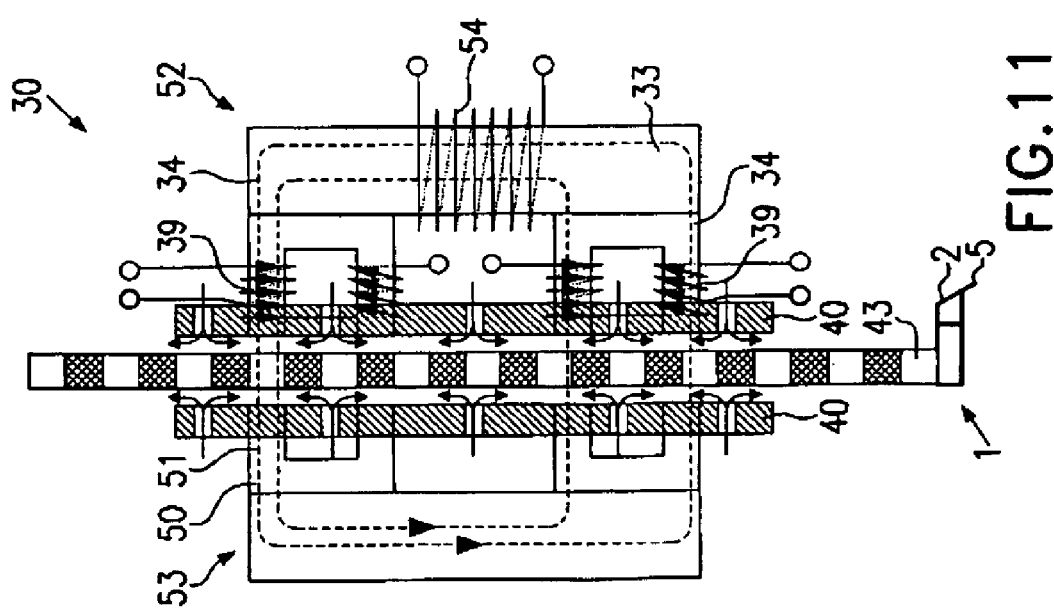
FIG. 11 is a schematic view of a third embodiment of a linear motor.

Preferably the test probe 1 according to the invention is moved by a linear motor, as shown in FIGS. 9 to 11.

The linear motor 30 shown in FIG. 9 has two magnetic flux elements 31, 32, U-shaped when viewed from the side, each having a base 33 and limbs 34 arranged at the ends of the base 33. In each case the base is made of a soft magnetic material. Each of the limbs 34 has a permanent magnet 35 adjacent to the base 33. The permanent magnets 35 of a magnetic flux element 31, 32 are each arranged alternately with their south pole or north pole adjacent to the base 33. On the side of the permanent magnet 35 facing away from the base there is provided in each case a pole piece 36, U-shaped when viewed from the side. Each of these pole pieces 36 has a base 37 and two pole walls 38, while they are arranged with their bases 37 adjacent to the permanent magnets 35. In each case the pole walls comprise driving coils 39. Each driving coil 39 extends over two pole walls 38 of a pole piece 36.

The sections of the driving coils which extend over a pole wall 38 are wound opposite to one another. On excitation of one of the driving coils 39, the magnetic flux generated by the permanent magnets is thus intensified in the area of one pole wall, and weakened in the area of the other pole wall of the same pole piece. Preferably the excitation current is set so that the magnetic flux is fully offset by the weakening in the area of one of the pole walls 38, and doubled in the area of the other pole wall. In the embodiment shown in FIG. 9, the driving coils 39 of the upper pole piece 36 are excited, thereby concentrating the magnetic flux through the upper pole walls of the two opposing pole pieces 36 (see magnetic flux lines 42). The driving coils of the lower pole pieces 36 are not excited, so that the magnetic flux is distributed evenly to both pole walls 38 of the pole pieces 36.

Provided at each free end of the pole walls 38 of the pole pieces 36 of the two magnetic flux elements 31, 32 is a guide plate 40, in which air nozzles 41 have been made at regular intervals. These air nozzles 41 are so designed that air can be blown in by the air nozzle 41 from the side at which the pole piece 36 fits against the guide plate 40, and exits on the other side of the guide plate 40.

The two magnetic flux elements 31, 32 with their guide plates 40 are arranged opposite one another in such a way that the permanent magnets 35 are arranged with the poles of the permanent magnets 35 alternating, so that the magnetic flux lines 42 run through both magnetic flux elements 31, 32.

The guide plates 40 of the two magnetic flux elements 31, 32 are mounted parallel to one another at a predetermined distance D.

Between the two guide plates 40 is an armature plate 43, made of a non-magnetic material such as for example ceramic material, plastic or a non-magnetic metal (e.g. aluminium or copper). Inserted into this armature plate 43 at regular intervals d are strip-shaped armature elements 45 made of magnetic material such as iron. The distance d between two adjacent armature elements 45 is chosen so that the following applies:

if an armature element 45 is located in the area between two pole walls 38 of two opposite pole pieces 36, then a section of the armature plate 43 made of non-magnetic material 44 is arranged in the area between the two other pole walls 38 of the same pole pieces 36, and there are in each case border zones between armature elements 45 and sections of non-magnetic material between the pairs of pole walls 38 of the other pole pieces 36 of the linear motor 30.

The test probe 1 according to the invention is attached to one end of the armature plate 43.

The mode of operation of the linear motor 30 will be explained in detail below.

In operation, air is blown from the air nozzles 41 on to the armature plate 43, causing the armature plate 43 to be held at a distance from the guide plates 40, so that there is no mechanical friction between the armature plate 43 and the guide plates 40. Here the air is blown in with a pressure of approx 2-6 bar, producing air cushions with a thickness of approx. 5-10 µm. These air cushions are self-centering, i.e. if the armature plate 43 should be pressed by external influences against one of the two guide plates, then the reducing distance increases the force, which recreates the original distance.

The driving coils 39 of the magnetic flux elements 31, 32 are excited alternately. By this means the magnetic flux of the permanent magnets 35 is concentrated in one pole wall 38 of a pole piece 36, and reduced in the other pole wall 38 of the pole piece. In FIG. 9 the driving coils 39 of the two upper pole pieces are excited, so that the magnetic flux is concentrated through the upper pole walls. The driving coils of the lower pole pieces 36 are not excited, so that the magnetic flux lines 42 are evenly distributed on both pole walls 38.

In the area of the opposite pole walls 38, through which the magnetic flux is concentrated, in each case the nearest armature element 45 is attracted, causing the armature plate 43 to move in direction of movement 46 (downwards or upwards). By driving the driving coils 39 with an excitation current pattern corresponding to a sine curve, the armature plate 43 may be moved evenly downwards or upwards, with the two driving coils driven by one each of the magnetic flux elements 31, 32 with a phase displacement of 90°. The driving coils arranged opposite are driven synchronously. This mode of driving conforms to that of known linear motors.

The principle of a linear motor according to the present invention lies in the fact that the armature plate with its armature elements 45 arranged linearly in a predetermined direction is moved by skillful magnetic driving over an area comprising several armature elements, and may be held at several points within this area, with the spacing of these holding points usually corresponding to half the distance between two adjacent armature elements.

A major benefit of the linear motor according to the invention is that the armature plate 43 is very light. In a prototype of the linear motor according to the invention, the armature plate weighs 10 g. This armature plate is a ceramic plate in which armature elements of soft iron material are inserted.

Because of the low weight of the armature plate and the test probe 1 according to the invention, they may be accelerated and braked rapidly with low forces. Since there is also no mechanical friction during movement of the armature plate, the movement forces which occur are very low. This permits very rapid contacting of the circuit board test points to be tested, while the low movement forces mean that the risk of damage to the circuit board is very low. Acceleration and deceleration of 800 m/s2 were obtained with the prototype of the present invention.

FIG. 10 shows a simplified embodiment of the linear motor shown in FIG. 9, in which once again two magnetic flux elements 47, 48 are provided, wherein the magnetic flux. element 47 is identical to the magnetic flux element 31 of FIG. 9, so that identical parts are provided with the same reference numbers.

The magnetic flux element 48 is comprised only of a base 49 and two limbs 50. The base 49 and the limbs 50 are made of a magnetic material. The magnetic flux element 48 is U-shaped when viewed from the side. The individual limbs 50 are again U-shaped viewed from the side, with pole walls 51, arranged in each case in pairs opposite the pole walls 38 of the magnetic flux element 48. The magnetic flux element 48 has in turn a guide plate 40 with air nozzles 41, which is attached to the free ends of the pole walls 51.

The magnetic flux element 48 thus forms a passive magnetic flux element opposite the active magnetic flux element 47.

The embodiment of the linear motor shown in FIG. 10 is substantially simpler and more cost-effective than the embodiment shown in FIG. 9.

FIG. 11 shows a third embodiment of a linear motor. This again has two magnetic flux elements 52, 53. The magnetic flux element 53 is identical to the passive magnetic flux element 48 of FIG. 10. Identical parts have therefore been given the same reference numbers. The magnetic flux element 52 has substantially the same form as the magnetic flux element 53 with a base 49 and two limbs 50 in the form of pole pieces, with each pole piece having two pole walls 51.

Only the pole walls 51 are somewhat longer, since the driving coils 39 for driving the armature plate 43 are provided on them. Instead of the permanent magnets of the embodiments described above, a coil 54 is arranged around the base 49 of the magnetic flux element 52, by means of which a static magnetic field is applied to the magnetic flux elements 52, 53. The force by which the armature plate 43 is held may be varied by changing the static magnetic field. The static magnetic field is therefore variable. The rates of change applicable to the static magnetic field are however much less than the rates of change of the magnetic fields generated by the driving coils 39, which are switched on and off or reversed at higher frequency.

Since by excitation of the driving coils, the static magnetic field is concentrated on the pole walls 38 in the manner described above with the aid of the embodiment according to FIG. 9, the force by which the armature plate is moved can also be controlled by varying this magnetic field. Very gentle contacting can thus be effected, so that with this linear motor it is also possible in principle to use a test probe with an unsprung test needle.

Figure 13:
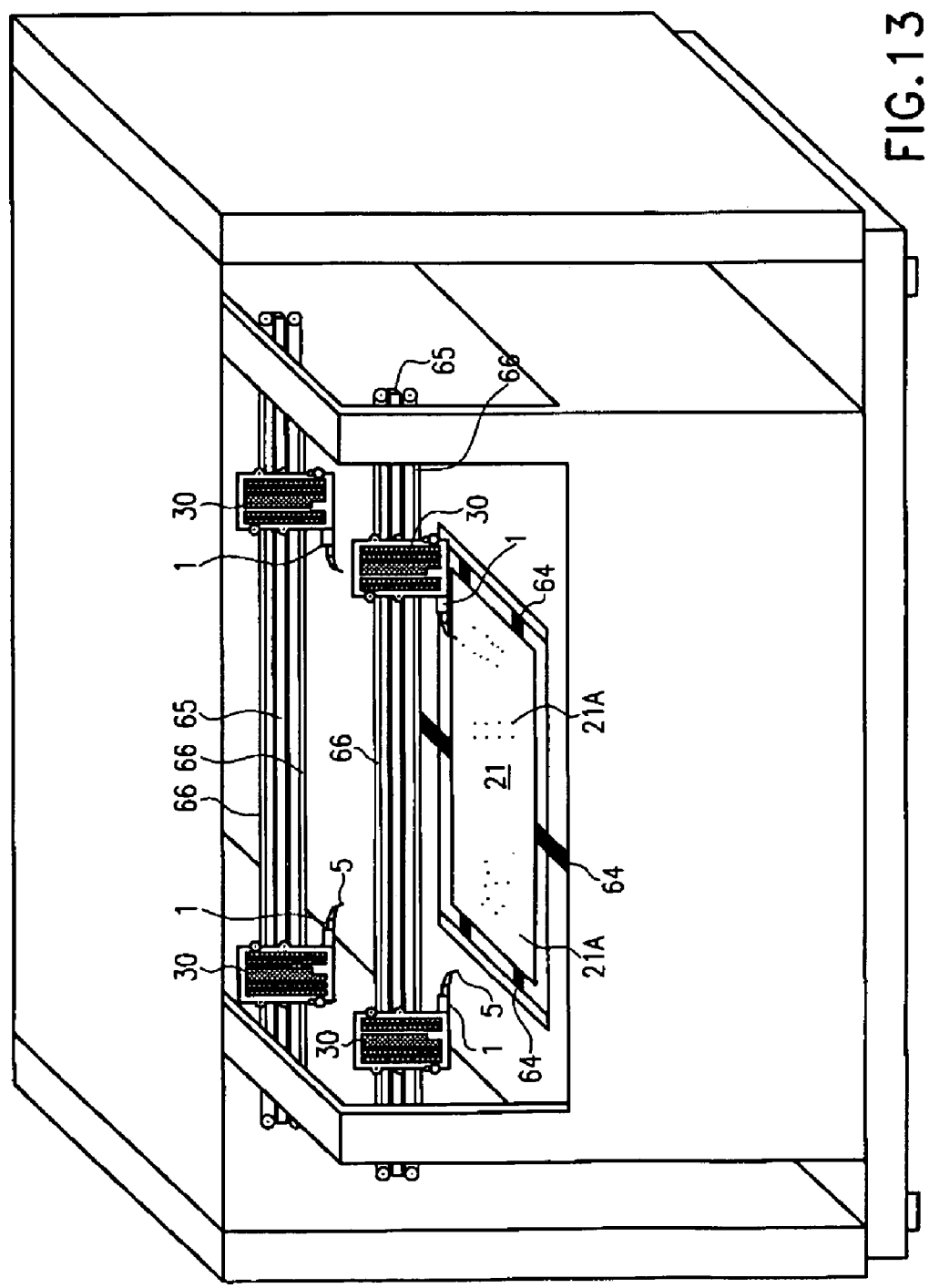
FIG. 13 is a schematic perspective view of a finger tester according to the invention.

FIG. 13 shows in schematic form a tester for the testing of non-componented circuit boards 21, which is a finger tester. The finger tester has several test heads 68, each formed by a test probe 1 according to the invention and one of the linear motors 30 described above.

The finger tester has an area for holding the circuit board to be tested 21, which is held by means of retaining elements 64. Located in the area above this holding area is at least one cross-bar 65 which extends over the holding area. Preferably there are several cross-bars 65, fixed to or also movable on the finger tester. If the cross-bars 65 are fixed immovably to the finger tester, then the test heads are provided with a swivel unit, by means of which at least the test probe 1 concerned may be swivelled around a vertical axis.

Each of the test heads 68 is coupled to a conveyor belt 66, by means of which it may be automatically traversed along the respective cross-bar 65. Preferably two test heads 68 are mounted on a cross-bar, so that two conveyor belts 66 are fitted to the cross-bars 65.

In operation the test probes 1 with their probe tips 5 are positioned, by means of a movement in the plane parallel to the circuit board 21, over a circuit board test point 22 to be tested. The contact tip is then lowered on to the circuit board test point 22 by means of the linear motor 30, until the probe tip 5 contacts the circuit board test point. The electrical measurement then takes place, after which the test probe is again raised and then traversed to the next circuit board test point.

Accelerations up to 80 g have been obtained with the linear motors according to the invention.

With the finger tester according to the invention, the vertical movement may be made at a higher velocity (e.g. 1.5 meters per second (m/s)), with minimal mechanical impulses being exerted on the circuit board test points. It has been shown in tests in which thin plastic film of flexible plastic materials such as e.g. FA 4, epoxy film, for example, has been inserted in the finger tester instead of circuit boards, that no contact impressions have been left on the film by the probe tips, even though the test probes were moved with maximum velocity on to the film.

The finger tester shown in FIG. 13 has test heads on only one side of the circuit board 21 to be tested. Within the scope of the invention it is of course possible to design the finger tester to have test heads, cross-bars, etc. on both sides of the circuit board to be tested.

The following is a list of reference numbers: 1-test probe; 2-test needle; 3-needle; 4-shield; 5-probe tip; 6-retaining arm; 7-retaining arm; 8-retaining arm; 9-retaining arm; 10-mount; 11-contact face; 12-pin; 13-slot; 14-through hole;

15-test head wall; 16-photoelectric switch element; 16a-base; 16b-limb; 17-measuring vane; 18-measuring edge; 19-direction of movement for contacting; 20-direction of movement 2; 21-circuit board; 21a-conductor path; 22-circuit board test point; 23-conductor; 24-current source; 25-conductor; 26-voltmeter; 27-trough; 28-base; 29-side wall; 29a-transverse web; 30-linear motor; 31-magnetic flux element; 32-magnetic flux element; 33-base; 34-limb; 35-permanent magnet; 36-pole piece; 37-base; 38-pole wall; 39-driving coil; 40-guide plate; 41-air nozzle; 42-magnetic flux line; 43-armature plate; 44-non-magnetic material; 45-armature element; 46-direction of movement; 47-magnetic flux element; 48-magnetic flux element; 49-base; 50-limb; 51-pole wall; 52-magnetic flux element; 53-magnetic flux element; 54-coil; 55-transverse web; 56-measuring vane; 57-base plate; 58-spacer sleeve; 59-plate; 60-wall; 61-contact pin; 62-contact plate; 63-conductor; 64-retaining element; 65-cross-bar; 66-conveyor belt; 67-connecting web; and 68-test head.

While this invention has been particularly shown and described with references to preferred embodiments thereof, it will be understood by those skilled in the art that various changes in form and details may be made therein without departing from the scope of the invention encompassed by the appended claims.

What is claimed is:

1. Test probe for a finger tester for the testing of circuit boards, with no independent drive, the test probe comprising:
    a test needle with a probe tip which may be brought into contact with a circuit board test point;
    a mount; and
    at least two pairs of flexible sprung retaining arms that pivotably attach the test needle to the mount,
    wherein at least one of the retaining arms is made of an electrically conductive wire element and is electrically connected to the test needle, and
    wherein each pair of retaining arms is mounted in one plane, with one end fixed to the test needle and the other end to the mount, and each pair of retaining arms spanning legs of a triangle having at least a partially open interior when viewed from above.

2. Test probe according to claim 1, wherein both pairs of retaining arms comprise a retaining arm made of an electrically conductive wire element and are electrically connected to the test needle.

3. Test probe according to claim 2, wherein the test needle is surrounded by a shield which is electrically connected to one or more of the retaining arms, which is electrically conductive and connected to earth and which pivotably attaches the test needle to the mount.

4. Test probe according to claim 1, wherein the test needle is surrounded by a shield which is electrically connected to one or more of the retaining arms, which is electrically conductive and connected to ground and which pivotably attaches the test needle to the mount.

5. Test probe according to claim 4, wherein the retaining arms span the shape of a trapezoid when viewed from the side.

6. Test probe according to claim 5, wherein the retaining arm or arms which is or are closer to the probe tip is or are longer than the retaining arm(s) which is or are further from the probe tip.

7. Test probe according to claim 1, wherein the retaining arms span the shape of a trapezoid when viewed from the side.

8. Test probe according to claim 7, wherein the retaining arm or arms which is or are closer to the probe tip is or are longer than the retaining arm(s) which is or are further from the probe tip.

9. Test probe according to claim 1, wherein the retaining arms are surrounded, at least in part, by a shield element.

10. Test probe according to claim 1, wherein a pre-tensioning element is provided to engage and pre-tension the retaining arms against the direction of contacting by a specific amount.

11. Test probe according to claim 1, wherein a position sensor is provided to determine the position of the test needle relative to the mount.

12. Test probe according to claim 1, wherein retaining arms are made from wire elements.

13. Test probe according to claim 1, wherein each pair of retaining arms is made from a wire element that is bent in a middle.

14. Test probe for a finger tester for the testing of circuit boards, comprises a test needle with a probe tip for contacting a circuit board test point, the test needle being attached to a mount by at least two pairs of flexible sprung retaining arms,
    wherein at least one of the retaining arms is an electrically conductive wire element and is electrically connected to the test needle, and
    wherein each pair of retaining arms is mounted in a different plane, with one end fixed to the test needle and the other end to the mount, and each pair of retaining arms spanning legs of a triangle having at least a partially open interior when viewed from above.

15. Test probe according to claim 14, wherein both pairs of retaining arms comprise a retaining arm being constructed from an electrically conductive wire element and being electrically connected to the test needle.

16. Test probe according to claim 15, wherein the test needle is surrounded by a shield which is electrically connected to one or more of the retaining arms, which is electrically conductive and connected to ground and which attaches the test needle to the mount.

17. Test probe according to claim 14, wherein the retaining arms span the shape of a trapezoid when viewed from the side.

18. Test probe according to claim 14, wherein the retaining arms are surrounded, at least in part, by a shield element.

19. Test probe according to claim 14, wherein a pre-tensioning element is provided, to pre-tension the retaining arms against the direction of contacting by a specific amount.

20. Test probe according to claim 14, wherein a position sensor is provided to determine the position of the test needle relative to the mount.

21. Test probe according to claim 14, wherein retaining arms are made from wire elements.

22. Test probe according to claim 14, wherein each pair of retaining arms is made from a wire element that is bent in a middle.

* * * * *